(12) United States Patent
Pu et al.

(10) Patent No.: US 12,107,206 B1
(45) Date of Patent: Oct. 1, 2024

(54) DISPLAY PANEL, DISPLAY DEVICE AND REPAIR METHOD THEREOF

(71) Applicant: HKC CORPORATION LIMITED, Shenzhen (CN)

(72) Inventors: Yang Pu, Shenzhen (CN); Haijiang Yuan, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 18/515,492

(22) Filed: Nov. 21, 2023

(30) Foreign Application Priority Data

May 9, 2023 (CN) .......................... 202310513760.1

(51) Int. Cl.
*H01L 29/205* (2006.01)
*H01L 25/16* (2023.01)
*H01L 33/00* (2010.01)
*H01L 33/62* (2010.01)
*H01L 33/64* (2010.01)

(52) U.S. Cl.
CPC .......... *H01L 33/641* (2013.01); *H01L 25/167* (2013.01); *H01L 33/62* (2013.01); *H01L 2933/0066* (2013.01)

(58) Field of Classification Search
CPC ..... H01L 33/641; H01L 25/167; H01L 33/62; H01L 2933/0066; H01L 23/34; H01L 2924/00; H01L 2224/00; H01L 2924/12043; H01L 31/08
See application file for complete search history.

(56) References Cited

U.S. PATENT DOCUMENTS

2020/0052161 A1* 2/2020 Wu ........................ H01L 33/62

FOREIGN PATENT DOCUMENTS

| CN | 110444648 | 11/2019 |
|---|---|---|
| CN | 115621374 | 1/2023 |
| KR | 102351470 | 1/2022 |

OTHER PUBLICATIONS

CNIPA, Notification to Grant Patent Right for Invention for CN Application No. 202310513760.1, Jun. 25, 2023.
CNIPA, First Office Action for CN Application No. 202310513760. 1, Jun. 9, 2023.

\* cited by examiner

*Primary Examiner* — Ismail A Muse
(74) *Attorney, Agent, or Firm* — Hodgson Russ LLP

(57) ABSTRACT

A display panel includes a drive backplane, the drive backplane being provided with a binding layer for fixing a light-emitting chip, and the display panel further includes a photoresistor disposed on a surface of the drive backplane and arranged close to the binding layer, the photoresistor having a resistance for being increased when the light-emitting chip is in an abnormal state, and the binding layer being configured to be in a molten state under an action of heat generated by the photoresistor when the light-emitting chip is in the abnormal state. The technical solution of the present application can reduce the damage of the binding layer and ensure that the normal light-emitting chip can be effectively repaired and replaced.

16 Claims, 5 Drawing Sheets

DISPLAY PANEL, DISPLAY DEVICE AND REPAIR METHOD THEREOF

CROSS-REFERENCE TO RELATED APPLICATIONS

This application claims priority to Chinese Patent Application No. 202310513760.1, filed May 9, 2023, the entire disclosure of which is incorporated herein by reference.

TECHNICAL FIELD

The present application relates to the technical field of display devices, and more particularly, to a display panel, a display device and a repair method thereof.

BACKGROUND

In the manufacturing process of Micro LED (Micro Light Emitting Diode Display) display panel, thousands or even tens of thousands of Micro LEDs need to be transferred from a growth substrate to a display panel. However, there may be some abnormal chips in these Micro LEDs, these abnormal chips cannot emit light normally. The disposal of abnormal chips is to break them by high-energy laser irradiation, and then remove these abnormal chips. However, this method is easy to damage the metal at the binding position, which makes it difficult to fix the newly provided normal light-emitting chip effectively.

SUMMARY

There are provided a display panel, a display device and a repair method thereof according to embodiments of the present disclosure. The technical solution is as below.

According to a first aspect of the embodiments of the present application, the present application provides a display panel, wherein the display panel includes a drive backplane, the drive backplane is provided with a binding layer, the binding layer is configured to fix a light-emitting chip, and the display panel further includes:

a photoresistor disposed on a surface of the drive backplane and arranged close to the binding layer, the photoresistor having a resistance for being increased when the light-emitting chip is in an abnormal state, and the binding layer being configured to be in a molten state under an action of heat generated by the photoresistor when the light-emitting chip is in the abnormal state.

According to a second aspect of the embodiments of the present application, the present application provides a display device including a light-emitting chip and the display panel as described above, and an electrode of the light-emitting chip is connected to the binding layer.

According to a third aspect of the embodiments of the present application, the present application also provides a repair method of the display device, which is applied to the display device as described above. The repair method of the display device includes:

detecting a lighting state of the light-emitting chip;
determining a position of an abnormal light-emitting chip as a repair position;
transferring and separating the abnormal light-emitting chip from the repair position through a transfer substrate with an adhesive layer; and
fixing a normal light-emitting chip at the repair position.

In the present application, it should be understood that the above general description and the following detailed description are exemplary and explanatory only and are not intended to limit the present application.

BRIEF DESCRIPTION OF DRAWINGS

The accompanying drawings, which are incorporated in and constitute a part of the description, illustrate embodiments consistent with the present application and, together with the description, serve to explain the principles of the present application. It will be apparent that the drawings described below are only some embodiments of the present application, and other drawings may be obtained from them without creative effort for those of ordinary skill in the art.

DESCRIPTION OF THE EMBODIMENTS

The exemplary embodiments will now be described more fully with reference to the accompanying drawings. However, the example embodiments can be implemented in a variety of forms and should not be construed as being limited to the examples set forth herein. Rather, these embodiments are provided so that the present application will be more comprehensive and complete, and the concept of exemplary embodiments will be fully communicated to those skilled in the art.

Embodiment I

Figure 1:
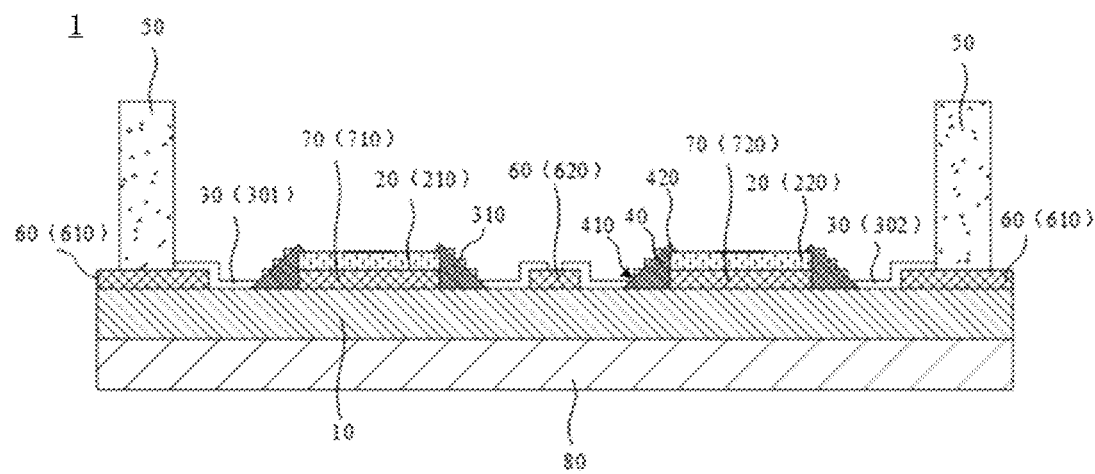
FIG. 1 schematically shows a structural diagram of a display panel in a first embodiment of the present application.

Referring to FIG. 1, the present application provides a display panel 1 including a drive backplane 10, a binding layer 20 and a photoresistor 30. The drive backplane 10 is provided with a driving thin film transistor (TFT) for driving the light-emitting chip 910. The binding layer 20 and the photoresistor 30 are both provided on the upper surface of the drive backplane 10. The lower surface of the drive backplane 10 is further provided with a substrate 80. The substrate 80 is configured to support the structure of the drive backplane 10, and the substrate 80 may be sapphire, quartz or the like. The resistance value of the photoresistor 30 is increased when the light-emitting chip 910 is in an abnormal state, and the binding layer 20 is configured to be in a molten state under an action of heat generated by the photoresistor 30 when the light-emitting chip 910 is in an abnormal state.

Specifically, the binding layer 20 is provided on the surface of the drive backplane 10, and the binding layer 20 is configured to fix the light-emitting chip 910, for example, the binding layer 20 is configured to fix the electrode of the light-emitting chip 910. The binding layer 20 melts when being heated to a certain extent, and changes from a cured state to the molten state. The binding layer 20 in the cured state can fix the electrodes of the light-emitting chip 910, thus completing bonding fixation of the light-emitting chip 910. The binding layer 20 in the molten state has certain fluidity, which weakens the fixation of the light-emitting chip 910.

The photoresistor 30 is provided on the surface of the drive backplane 10 and is arranged close to the binding layer 20. The photoresistor 30 is adjacent to the binding layer 20, but is spaced apart from the binding layer 20. When power is supplied to the light-emitting chip 910, the current flowing to the binding layer 20 is prevented from flowing to the photoresistor 30. The luminous interference caused by the photoresistor 30 to the light-emitting chip 910 is reduced. The photoresistor 30 also refers to light pipe, which is commonly made of cadmium sulfide, and also includes selenium, aluminum sulfide, lead sulfide and bismuth sulfide.

These photoresistors 30 have a characteristic that their resistance value decreases rapidly under light irradiation. Therefore, when the light-emitting chip 910 is abnormal, the light-emitting chip 910 cannot be lit or its brightness is insufficient. In this case, heat generated by the photoresistor 30 acts on the binding layer 20, causing the binding layer 20 to be in the molten state, thereby separating the light-emitting chip 910 from the binding layer 20.

In this embodiment, the photoresistor 30 is provided near the binding layer 20, and the binding layer 20 can be configured to fix the light-emitting chip 910. The resistance of the photoresistor 30 will change under the influence of light, in the presence of light, the resistance of the photoresistor 30 decreases, and in the absence of light, the resistance of the photoresistor 30 increases. When the light-emitting chip 910 is fixed after transferring, the light-emitting chip 910 can normally display and emit light, the value of the corresponding photoresistor 30 is reduced, and the heat generated by the photoresistor 30 is also reduced, so that the heat radiated by the photoresistor 30 is also reduced, and the binding layer 20 is radiated by a small amount of heat, and the fixed state remains unchanged, thus keeping the light-emitting chip 910 fixed. If the light-emitting chip 910 cannot display and emit light normally, the value of the corresponding photoresistor 30 will increase, and the heat generated by the photoresistor 30 will also increase, so that the binding layer 20 will receive more heat radiation, and the binding layer 20 is melted, thus relieving the fixation of the light-emitting chip 910. In this way, it is easy to replace the abnormal light-emitting chip 910 that loses fixation, thereby reducing the damage to the binding layer 20 and ensuring that the newly provided normal light-emitting chip can be effectively repaired and fixed.

The photoresistors 30 are arranged near the binding layer 20 in a variety of ways, for example, the photoresistors 30 are arranged in only one direction, the photoresistors 30 are arranged at four corners of the binding layer 20, the photoresistors 30 are arranged symmetrically on the left and right sides, or the photoresistors 30 are arranged in a semi-enclosed manner.

In addition, for the heat radiation effect of the binding layer 20, the photoresistor 30 is disposed in a full circle around the binding layer 20. In this way, the binding layer 20 is surrounded in the middle, and the photoresistors 30 are arranged around the binding layer 20. When the light-emitting chip 910 needs to be removed, the photoresistors 30 arranged around the light-emitting chip 910 simultaneously generate heat, so as to ensure that the periphery of the light-emitting chip 910 is uniformly heated, so that the fixing force can be reduced all around the electrodes of the light-emitting chip 910, thus making it easier for the light-emitting chip 910 to be separated from the metal binding layer. The occurrence of the situation that some parts are separated and the other parts are connected will be reduced.

Further, in order to improve the heat generation effect, the photoresistor 30 includes a resistance wire 310, a plurality of turns of resistance wire 310 are provided, and the plurality of turns of the resistance wire 310 are arranged at intervals in a direction gradually approaching the binding layer 20, and wound around the binding layer 20, and the plurality of turns of resistance wire 310 are connected with one another to ensure that the plurality of turns of the resistance wire 310 are energized simultaneously. It can be understood that the resistor wire 310 is provided to reduce the cross-sectional area of the photoresistor 30, where the resistance value of the resistor will increase, and the amount of heat generated under the same current will be elevated. This improves the heat generated by the photoresistor 30.

In addition, the plurality of turns of the resistance wire 310 are provided in a circle around the binding layer 20, so that the binding layer 20 is centered in the middle layer by layer, the heat dissipation area of the resistance wire 310 is increased, and the heat generated thereby can be applied to the binding layer 20 in the middle, thereby improving the melting efficiency of the binding layer 20. The resistance wire 310 is finished by evaporation, photolithography, and etching. The resistance wire 310 can increase the length of the photoresistor 30 and increase the generated heat.

The resistance wire 310 may also be arranged around the binding layer 20 in such a manner that the resistance wire 310 is spirally connected around the binding layer 20. The resistance wire 310 may be in a shape of wavy, to increase the length of the resistance wire 310.

Figure 2:
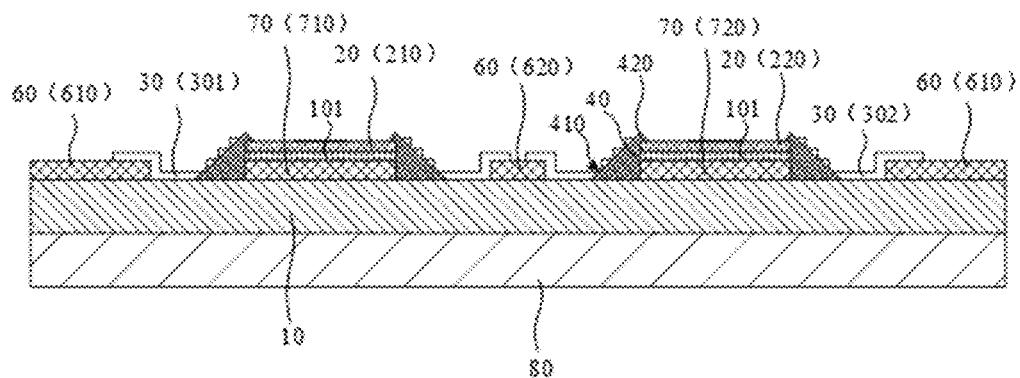
FIG. 2 schematically shows another structural diagram of the display panel in the first embodiment of the present application.
Figure 3:
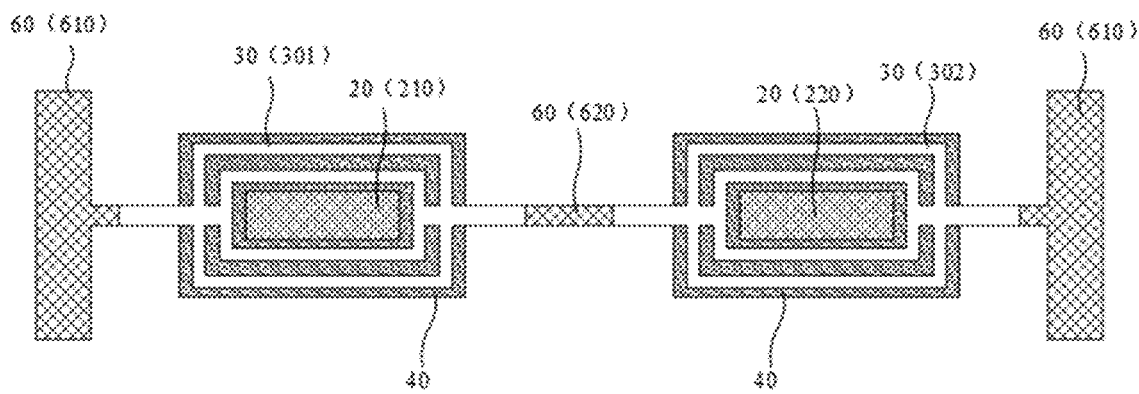
FIG. 3 schematically shows a top view of the display panel of FIG. 2 of the present application.

The electrodes of the light-emitting chip 910 are fixed in the binding layer 20, and the binding layer 20 is melted from the upper surface so that the electrodes can be separated from the binding layer 20. However, the binding layer 20 itself has a certain thickness, in order to make the electrodes of the light-emitting chip 910 detach from the binding layer 20, as shown in FIGS. 2 and 3, the display panel 1 includes a pad layer 40, the pad layer 40 is arranged around the binding layer 20, the pad layer 40 has a guide slope 410, and the guide slope 410 extends from the surface of the drive backplane 10 to the upper surface of the binding layer 20, the photoresistor 30 is at least partially arranged on the guide slope 410. By providing the pad layer 40, the photoresistor 30 extends to the upper surface of the binding layer 20 along the guide slope 410 of the pad layer 40, and the heat generated by the photoresistor 30 can soften and melt the binding layer 20 from the upper surface, so that the light-emitting chip 910 can quickly detach from the binding layer 20.

In order to increase the heat dissipation area, the guide slope 410 has an included angle θ with the surface of the drive backplane 10, and the angle satisfies 20°≤θ≤60°. The angle θ can be one of 20°, 21°, 22°, 23°, 24°, 25°, 26°, 27°, 28°, 29°, 30°, 31°, 32°, 33°, 34°, 35°, 36°, 37°, 38°, 39°, 40°, 41°, 42°, 43°, 44°, 45°, 46°, 47°, 48°, 49°, 50°, 51°, 52°, 53°, 54°, 55°, 56°, 57°, 58°, 59° and 60°. The photoresistor 30 is obtained by deposition etching. If the angle between the guide slope 410 and the surface of the drive backplane 10 is too large, i.e., the guide slope 410 is too steep, the photoresistor 30 is easily broken when the photoresistor 30 is etched. If the angle between the guide slopes 410 and the surface of the drive backplane 10 is too small, the guide slopes 410 occupy a large area, which easily exceeds the configuration range of a single light-emitting chip 910 and easily interferes with other adjacent diode structures. For this reason, the angle between the guide slope 410 and the surface of the drive backplane 10 ranges from 20° to 60°. Of course, considering the machining error, the angle range will change in a certain range around 20° and 60°. For example, it will change from +1° to ±5°.

In order to improve the firmness of the binding layer 20 on the drive backplane 10, the pad layer 40 includes a lap portion 420, and the lap portion 420 is provided on an upper surface of the binding layer 20. The pad layer 40 can be arranged by coating. The pad layer 40 is made of a transparent organic material, such as PI (Polyimide), which has high temperature resistance of over 400° C., a long-term use temperature range of −200-300° C., and some of them have no significant melting point, and has high insulation performance. The pad layer 40 can also be PMMA (Polymethyl methacrylate), which is a kind of high molecular polymer, also known as acrylic or plexiglass, and has the advantages of high transparency and easy machining.

After the binding layer 20 is provided, the pad layer 40 is provided around the binding layer 20 and can be fixed to the upper surface of the binding layer 20 by the arrangement of the lap portion 420, thereby forming a top-to-bottom securing force to ensure that the binding layer 20 is fixed to the surface of the drive backplane 10 and to prevent the binding layer 20 from falling off.

In order to reduce the influence of external light on the photoresistor 30, the display panel 1 includes a light shielding part 50, and light shielding part 50 is provided on the surface of the drive backplane 10 and surrounds the photoresistor 30. Specifically, the light shielding part 50 separates and shields each light-emitting chip 910. The light shielding part 50 is substantially opaque, and the height of the light shielding part 50 is equal to or slightly higher than the height of the light-emitting chip 910. For example, it is about 1 um to 2 um higher than the light-emitting chip.

In this way, the light generated by each light-emitting chip 910 can only act in an area formed by the enclosure of the light shielding part 50, so as to avoid affecting the binding layer 20 corresponding to other light-emitting chips 910, and prevent the light from irradiating the photoresistor 30 corresponding to the abnormal light-emitting chip 910, resulting in the abnormal light-emitting chip 910 being unable to be detached. This reduces the interaction of light generated by the light-emitting chip 910, and the influence of external light on the photoresistor 30 can also be reduced. The light shielding part 50 may be provided on the conductive layer 60. During processing, the producing of the circuit of the conductive layer 60 is completed prior to that of the light shielding part 50, to prevent the circuit of the conductive layer 60 from being divided by the light shielding part 50.

When power is supplied to the light-emitting chip 910, the current flowing to the light-emitting chip 910 easily affects the photoresistor 30. For this purpose, the display panel 1 includes a conductive layer 60 and an electrode layer 70, the conductive layer 60 includes a first conductive layer 610 and a second conductive layer 620, the electrode layer 70 is disposed between the binding layer 20 and the drive backplane 10, the first conductive layer 610, the second conductive layer 620 and the electrode layer 70 are arranged in the same layer, the first conductive layer 610 is connected at a side of the photoresistor 30, the second conductive layer 620 is connected at another side of the photoresistor 30, and the photoresistor 30 and the electrode layer 70 are spaced apart from one another. When supplying power to the photoresistor 30, the current flows from the first conductive layer 610 to the photoresistor 30, and then flows out through the second conductive layer 620, thereby forming a current path flowing through the photoresistor 30, so that the photoresistor 30 can smoothly generate heat. At the same time, the positive and negative electrodes of the light-emitting chip 910 also flow with current.

The photoresistor 30 and the electrode layer 70 are spaced apart so that the current path flowing through the light-emitting chip 910 and the current passing through the photoresistor 30 are spaced apart to avoid mutual interference.

Further, the binding layer 20 includes a first metal layer 210 and a second metal layer 220, the first metal layer 210 is configured to fix an anode of the light-emitting chip 910, the second metal layer 220 is configured to fix a cathode of the light-emitting chip 910. The photoresistor 30 includes a first resistor 301 and a second resistor 302, the first resistor 301 is disposed corresponding to the first metal layer 210, and the second resistor 302 is disposed corresponding to the second metal layer 220. The first resistor 301 is disposed around the first metal layer 210, the second resistor 302 is disposed around the second metal layer 220, and the second conductive layer 620 is disposed between the first metal layer 210 and the second metal layer 220. The first resistor 301 is connected at a side of the second conductive layer 620, and the second resistor 302 is connected at another side of the second conductive layer 620. By connecting the two photoresistors 30 together in series through the second conductive layer 620, the on/off of the current flow to the first resistor 301 and the second resistor 302 can be controlled simultaneously. The electrode layer 70 includes a positive electrode layer 710 and a negative electrode layer 720. The positive electrode layer 710 is disposed between the first metal layer 210 and the drive backplane 10, and the negative electrode layer 720 is disposed between the second metal layer 220 and the drive backplane 10.

In addition, more photoresistors 30 may be connected in series so that the lines configured to arrange the first conductive layer 610 and the second conductive layer 620 may be reduced. It is not easy to have too many photoresistors 30 connected together in series, and if too many photoresistors 30 are connected together in series, the impedance will easily become large. For this purpose, two photoresistors 30 corresponding to one light-emitting chip 910 may be connected in series, i.e., the first resistor 301 and the second resistor 302 are connected in series.

Embodiment II

Figure 4:
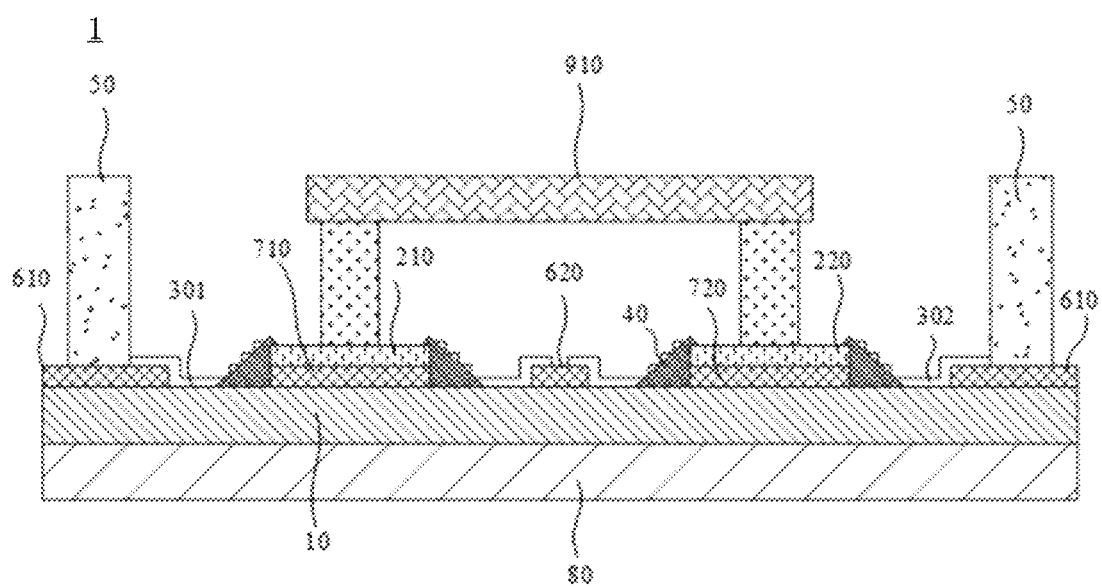
FIG. 4 schematically shows a structural diagram of the display device in a second embodiment of the present application.

Referring to FIG. 4, the present application also provides a display device, the display device includes a light-emitting chip 910 and a display panel 1 as described above, an electrode of the light-emitting chip 910 is connected to the binding layer 20. The current supplied to the light-emitting chip 910 flows to the light-emitting chip 910 through the binding layer 20 while the binding layer 20 can also serve to fix the electrode of the light-emitting chip 910.

The specific implementation and beneficial effects of the display device can be referred to the display panel 1 for detecting the light-emitting chip 910 as described above, and will not be repeated herein.

Embodiment III

Referring to FIG. 4 to FIG. 7, the present application also provides a repair method of a display device. The repair method of the display device is applied to the display device as described above. The repair method of the display device includes:

Step S10, a lighting state of the light-emitting chip 910 is detected. An operating electric signal is supplied to the light-emitting chip 910, to detect the light-emitting chip 910. The operating electric signal is a signal capable of ensuring that the light-emitting chip 910 is normally lit, and the operating point signal may be a current signal or a voltage signal. After the light-emitting chip 910 receives the operating electric signal, if the light-emitting chip 910 is normal, the light-emitting chip 910 can be lit, and the light-emitting chip 910 is configured to be a normal light-emitting chip 910. If the light-emitting chip 910 is abnormal and the light-emitting chip 910 cannot be lit, the light-emitting chip 910 is confirmed to be an abnormal light-emitting chip 910 and the corresponding position is recorded. It should be noted that the abnormal light-emitting chip 910 may also be lit, but the brightness is low and does not meet the requirements. That is to say, the light-emitting chip 910 whose brightness does not meet the requirements is also categorized as an abnormal light-emitting chip and needs to be repaired.

Step S20, the position of the abnormal light-emitting chip 910 is determined as a repair position. The light-emitting chips 910 are arranged in a matrix manner on the display panel 1, each of light-emitting chips 910 has a fixed position, and an xy coordinate system can be established on the plane of the display panel 1, and each of the light-emitting chips 910 has its own coordinates. By recording the coordinate position, the position of the abnormal light-emitting chip 910 can be determined.

Figure 5:
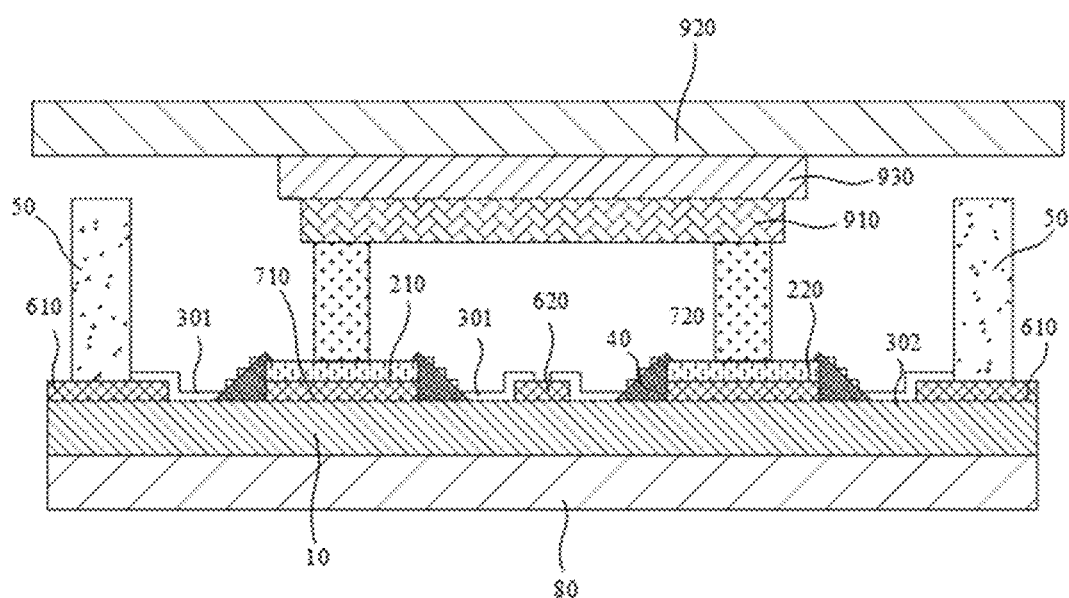
FIG. 5 schematically shows a structural diagram of the display device when a transfer substrate contacts a light-emitting chip in the present application.
Figure 6:
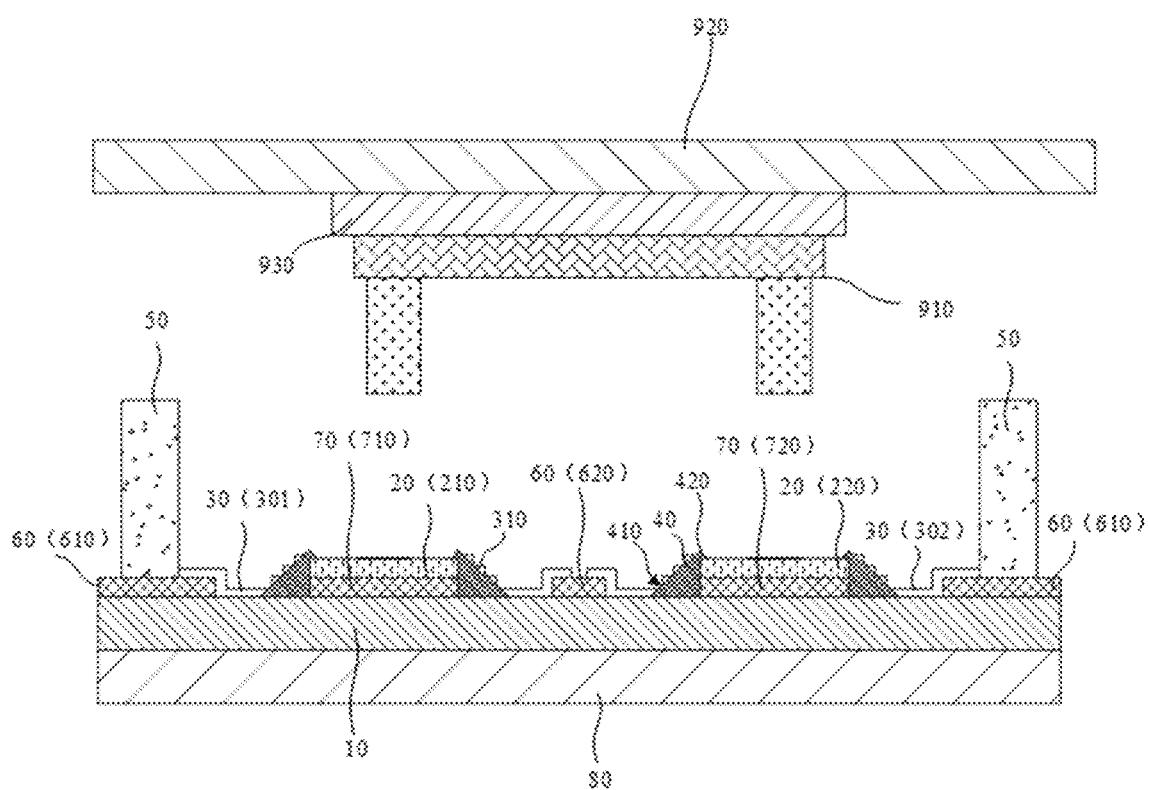
FIG. 6 schematically shows a structural diagram of the display device when the transfer substrate of FIG. 5 is separated from the light-emitting chip.
Figure 7:
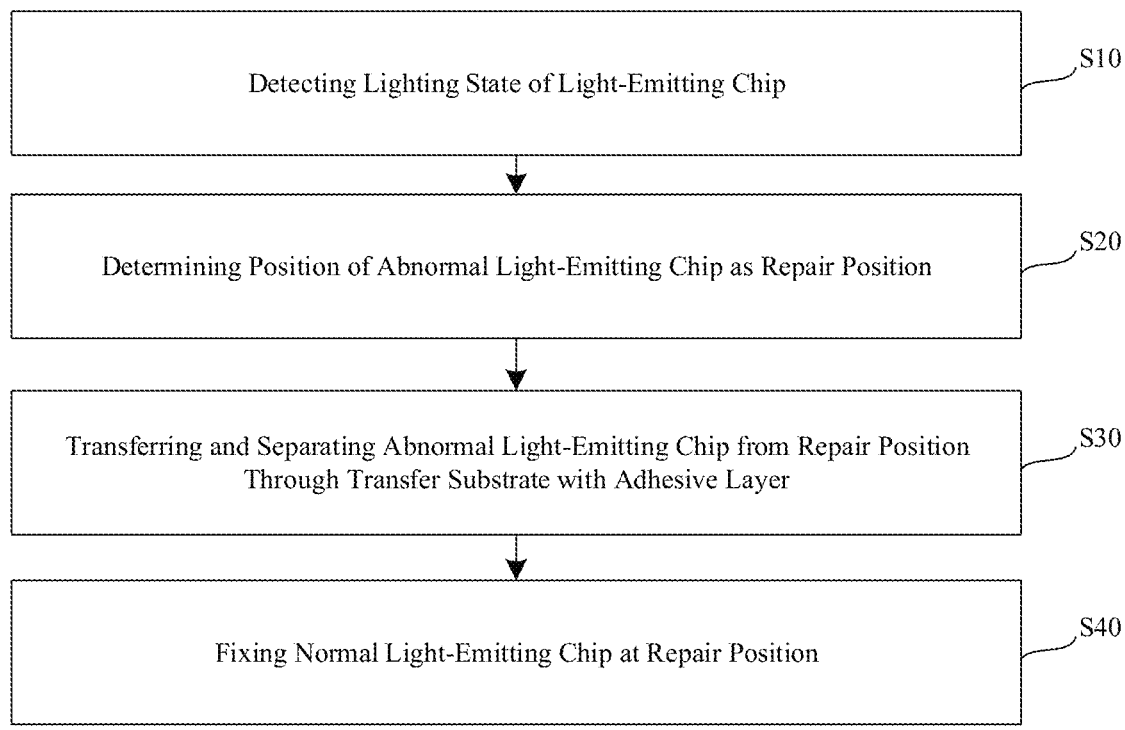
FIG. 7 schematically shows a flow chart of a repair method for a display device in a third embodiment of the present application.

Step S30, the abnormal light-emitting chip 910 is transferred and separated from the repair position by the transfer substrate 920 with the adhesive layer 930, as shown in FIGS. 5 and 6. Since the heat generated by a photoresistor to the abnormal light-emitting chip 910 can melt the binding layer 20, the binding layer 20 weakens the fixation of the abnormal light-emitting chip 910, and after the adhesive layer is adhered to the abnormal light-emitting chip 910, the abnormal light-emitting chip 910 can be taken away from the repair position. The adhesive layer 930 of the transfer substrate 920 is Polydimethylsiloxane.

In step S40, the normal light-emitting chip 910 is fixed at the repair position. The normal light-emitting chip 910 is moved to the repair position by the transfer substrate 920 and the newly provided light-emitting chip 910 is fixed by the metal binding layer. When transferring a new light-emitting chip, nitrogen can be filled into the repair position to prevent the metal binding layer from oxidizing.

The binding layer 20 may be tin or indium or a mixture of tin and indium. After the abnormal light-emitting chip 910 is moved away, the binding layer 20 is dispersed or cluttered due to flowing, resulting in the surface being not smooth enough. Referring to FIG. 2, an under bump metal layer 101 is provided between the binding layer 20 and the electrode layer 70 in order to ensure that the new light-emitting chip 910 can be effectively fixed. The binding layer 20 is well-wetted when it is on the under bump metal layer 101, and it melts and self-aggregates, spontaneously aggregates on the surface of the under bump metal layer 101, to form a smooth hemispherical surface.

Other embodiments of the present application will be apparent to those skilled in the art upon consideration of the description and practice of the present application disclosed herein. The present application is intended to encompass any variation, use, or adaptation of the present application that follows the general principles of the present application and includes commonly known or customary technical means in the art that are not disclosed herein.

It should be understood that the present application is not limited to the precise structure already described above and illustrated in the accompanying drawings, and that various modifications and changes may be made without departing from its scope. The scope of the present application is defined by the appended claims only.

What is claimed is:

1. A display panel comprising a drive backplane, the drive backplane being provided with a binding layer for fixing an electrode of a light-emitting chip, wherein the display panel further comprises:
   a photoresistor disposed on a surface of the drive backplane and arranged close to the binding layer, the photoresistor being spaced apart from the binding layer, a resistance of the photoresistor increases as a current flows through the photoresistor in response to the light-emitting chip being in an abnormal state, and the binding layer being configured to be in a molten state under an action of heat generated due to the current flowing through the photoresistor in response to the light-emitting chip being in the abnormal state;
   wherein the display panel further comprises a light shielding part provided on the surface of the drive backplane and surrounding the photoresistor.

2. The display panel according to claim 1, wherein the photoresistor is arranged in a full circle around the binding layer.

3. The display panel according to claim 1, wherein the photoresistor comprises a resistance wire;
   wherein the resistance wire is provided in a plurality of turns, the plurality of turns of the resistance wire being arranged at intervals in a direction gradually approaching the binding layer, and wound around the binding layer, and the plurality of turns of the resistance wire being connected with one another; or
   wherein the resistance wire is spirally connected around the binding layer.

4. The display panel according to claim 1, wherein the display panel comprises a pad layer, the pad layer being disposed around a periphery of the binding layer, the pad layer having a guide slope extending from the surface of the drive backplane to an upper surface of the binding layer, and at least a part of the photoresistor being disposed on the guide slope.

5. The display panel according to claim 4, wherein an angle $\theta$ formed between the guide slope and the surface of the drive backplane satisfies $20° \leq \theta \leq 60°$.

6. The display panel according to claim 1, wherein the light shielding part separates and shields each light-emitting chip; wherein a height of the light shielding part is equal to or higher than a height of the light-emitting chip.

7. The display panel according to claim 1, wherein the display panel comprises a conductive layer and an electrode layer, the conductive layer comprising a first conductive layer and a second conductive layer, the first conductive layer, the second conductive layer and the electrode layer being arranged in a same layer, the electrode layer being arranged between the binding layer and the drive backplane, the first conductive layer being connected at a side of the photoresistor, the second conductive layer being connected at another side of the photoresistor, and the photoresistor and the electrode layer being spaced apart from one another.

8. The display panel according to claim 7, wherein the binding layer comprises a first metal layer for fixing an anode of the light-emitting chip and a second metal layer for fixing a cathode of the light-emitting chip; and wherein the photoresistor comprises a first resistor arranged corresponding to the first metal layer and a second resistor arranged corresponding to the second metal layer, the second conductive layer being arranged between the first metal layer and the second metal layer, the first resistor being connected at a side of the second conductive layer, and the second resistor being connected at another side of the second conductive layer.

9. A display device comprising a light-emitting chip and a display panel, wherein an electrode of the light-emitting chip is connected to a binding layer; wherein the display panel comprises a drive backplane, the drive backplane being provided with the binding layer for fixing the electrode of the light-emitting chip, wherein the display panel further comprises:

a photoresistor disposed on a surface of the drive backplane and arranged close to the binding layer, the photoresistor being spaced apart from the binding layer, a resistance of the photoresistor increases as a current flows through the photoresistor in response to the light-emitting chip being in an abnormal state, and the binding layer being configured to be in a molten state under an action of heat generated due to the current flowing through the photoresistor in response to the light-emitting chip being in the abnormal state;

wherein the display panel further comprises a light shielding part provided on the surface of the drive backplane and surrounding the photoresistor.

10. The display device according to claim 9, wherein the photoresistor is arranged in a full circle around the binding layer.

11. The display device according to claim 9, wherein the photoresistor comprises a resistance wire;

wherein the resistance wire is provided in a plurality of turns, the plurality of turns of the resistance wire being arranged at intervals in a direction gradually approaching the binding layer, and wound around the binding layer, and the plurality of turns of the resistance wire being connected with one another; or wherein the resistance wire is spirally connected around the binding layer.

12. The display device according to claim 9, wherein the display panel comprises a pad layer, the pad layer being disposed around a periphery of the binding layer, the pad layer having a guide slope extending from the surface of the drive backplane to an upper surface of the binding layer, and at least a part of the photoresistor being disposed on the guide slope.

13. The display device according to claim 12, wherein an angle θ formed between the guide slope and the surface of the drive backplane satisfies $20°≤θ≤60°$.

14. A repair method of a display device, wherein the repair method of the display device is applied to a display device, wherein the display device comprises a light-emitting chip and a display panel; wherein an electrode of the light-emitting chip is connected to a binding layer; wherein the display panel comprises a drive backplane, the drive backplane being provided with a binding layer for fixing the electrode of a light-emitting chip, wherein the display panel further comprises:

a photoresistor disposed on a surface of the drive backplane and arranged close to the binding layer, the photoresistor being spaced apart from the binding layer, a resistance of the photoresistor increases as a current flows through the photoresistor in response to the light-emitting chip being in an abnormal state, and the binding layer being configured to be in a molten state under an action of heat generated due to the current flowing through the photoresistor in response to the light-emitting chip being in the abnormal state;

wherein the display panel further comprises a light shielding part provided on the surface of the drive backplane and surrounding the photoresistor;

wherein the repair method of the display device comprises:

detecting a lighting state of the light-emitting chip;

determining a position of an abnormal light-emitting chip as a repair position;

transferring and separating the abnormal light-emitting chip from the repair position through a transfer substrate with an adhesive layer; and fixing a normal light-emitting chip at the repair position.

15. The repair method of the display device according to claim 14, wherein filling nitrogen into the repair position to prevent metal of the binding layer from oxidizing, when transferring a new light-emitting chip.

16. The repair method of the display device according to claim 14, wherein providing an under bump metal layer between the binding layer and an electrode layer, wherein the electrode layer is arranged between the binding layer and the drive backplane.

\* \* \* \* \*